(12) United States Patent
Zhang et al.

(10) Patent No.: US 11,482,673 B2
(45) Date of Patent: Oct. 25, 2022

(54) SOLAR BATTERY

(71) Applicants: Tsinghua University, Beijing (CN); HON HAI PRECISION INDUSTRY CO., LTD., New Taipei (TW)

(72) Inventors: Jin Zhang, Beijing (CN); Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 159 days.

(21) Appl. No.: 16/903,167

(22) Filed: Jun. 16, 2020

(65) Prior Publication Data

US 2021/0143334 A1 May 13, 2021

(30) Foreign Application Priority Data

Nov. 8, 2019 (CN) .......................... 201911090236.8

(51) Int. Cl.
*H01L 51/00* (2006.01)
*H01L 51/42* (2006.01)
(Continued)

(52) U.S. Cl.
CPC ...... *H01L 51/0048* (2013.01); *H01L 51/4206* (2013.01); *H01L 51/441* (2013.01); *B82Y 30/00* (2013.01)

(58) Field of Classification Search
CPC .............. H01L 51/0048; H01L 51/4206; H01L 51/441
See application file for complete search history.

(56) References Cited

U.S. PATENT DOCUMENTS 5,282,902 A * 2/1994 Matsuyama ........ H01L 31/0236
136/249
7,719,032 B2 5/2010 Maruyama et al.
(Continued)

FOREIGN PATENT DOCUMENTS

CN 107564947 1/2018
CN 108933166 12/2018
(Continued)

OTHER PUBLICATIONS

Bow et al., "Power Transistor 2N3055 as a Solar Cell Device", International Conference on Electrical Engineering and Computer Science (ICECOS) 2018, pp. 1-6. (Year: 2018).*
(Continued)

*Primary Examiner* — Tae-Sik Kang
(74) *Attorney, Agent, or Firm* — ScienBiziP, P.C.

(57) ABSTRACT

The present disclosure relates to a solar battery. The solar battery comprises a semiconductor structure, a back electrode, and an upper electrode. The semiconductor structure defines a first surface and a second surface. The semiconductor structure comprises an N-type semiconductor layer and a P-type semiconductor layer. The back electrode is located on the first surface. The upper electrode is located on the second surface. The back electrode comprises a first carbon nanotube, the upper electrode comprises a second carbon nanotube, and the first carbon nanotube intersects with the second carbon nanotube. A multilayer structure is formed by an overlapping region of the first carbon nanotube, the semiconductor structure and the second carbon nanotube.

19 Claims, 4 Drawing Sheets

(51) Int. Cl.
  *H01L 51/44* (2006.01)
  *B82Y 30/00* (2011.01)

(56) References Cited

U.S. PATENT DOCUMENTS

| | | | |
|---|---|---|---|
| 2018/0006227 A1 | 1/2018 | Zhang et al. | |
| 2018/0006231 A1 | 1/2018 | Zhang et al. | |
| 2018/0006252 A1 | 1/2018 | Zhang et al. | |
| 2018/0006255 A1* | 1/2018 | Zhang | C22C 26/00 |
| 2018/0342580 A1 | 11/2018 | Zhang et al. | |
| 2018/0342632 A1 | 11/2018 | Zhang et al. | |
| 2018/0342690 A1 | 11/2018 | Zhang et al. | |
| 2019/0006450 A1* | 1/2019 | Lee | H01L 29/1606 |

FOREIGN PATENT DOCUMENTS

| | | |
|---|---|---|
| CN | 108933182 | 12/2018 |
| CN | 108963003 | 12/2018 |
| CN | 107564979 | 8/2019 |
| JP | 2004-171903 | 6/2004 |
| JP | 2005-116618 | 4/2005 |
| JP | 2012-146982 | 8/2012 |
| JP | 2018-6754 | 1/2018 |
| JP | 2018-006755 | 1/2018 |
| JP | 2018-198312 | 12/2018 |
| JP | 2018-198313 | 12/2018 |
| JP | 2018-198314 | 12/2018 |
| TW | 201802025 | 1/2018 |
| TW | 201802951 | 1/2018 |
| TW | 201803147 | 1/2018 |
| TW | 201901937 | 1/2019 |
| TW | I656654 | 4/2019 |

OTHER PUBLICATIONS

"Field-Effect Transistors", Cathleen Shamieh, Mar. 26, 2016, From the Book: Electronics for Dummies, 3rd Edition, [online], [retrieved on Jan. 21, 2022]. Retrieved from the Internet:<URL: https://www.dummies.com/article/technology/electronics/general-electronics/field-effect-transistors-141372>, pp. 1-4. (Year: 2016).*

* cited by examiner

SOLAR BATTERY

CROSS-REFERENCE TO RELATED APPLICATIONS

This application claims all benefits accruing under 35 U.S.C. § 119 from China Patent Application No. 201911090236.8, filed on Nov. 8, 2019, in the China Intellectual Property Office, the contents of which are hereby incorporated by reference. The application is also related to co-pending applications entitled, "LIGHT EMITTING DIODE", filed Jun. 16, 2020 Ser. No. 16/903,164. The application is also related to co-pending applications entitled, "SEMICONDUCTOR STRUCTURE AND SEMICONDUCTOR DEVICE USING THE SAME", filed Jun. 16, 2020 Ser. No. 16/903,171. The application is also related to co-pending applications entitled, "PHOTOELECTRIC DETECTOR", filed Jun. 16, 2020 Ser. No. 16/903,161.

FIELD

The present disclosure relates to a solar battery.

BACKGROUND

Solar batteries are made using photovoltaic principle of semiconductor materials. According to the types of semiconductor photoelectric conversion materials, solar batteries can be classified into silicon-based solar batteries, gallium arsenide solar batteries, and organic thin-film solar batteries. Currently, solar batteries are mainly silicon-based solar batteries.

Conventional materials of an upper electrode and a back electrode of a solar battery are mostly metal, conductive polymer, or indium tin oxide. However, light can be absorbed or reflected seriously by metal, conductive polymer, or indium tin oxide; as such, a photoelectric conversion efficiency of conventional solar batteries is limited.

BRIEF DESCRIPTION OF THE DRAWINGS

Implementations of the present technology will now be described, by way of example only, with reference to the attached figures, wherein.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Figure 1:
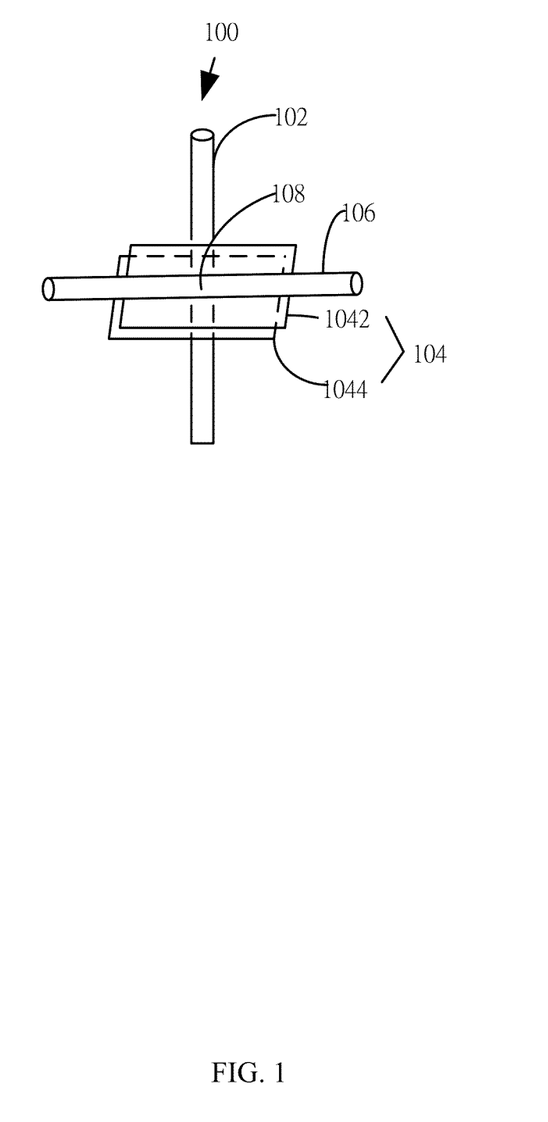
FIG. 1 is a structural schematic view of one embodiment of a solar battery.
Figure 2:
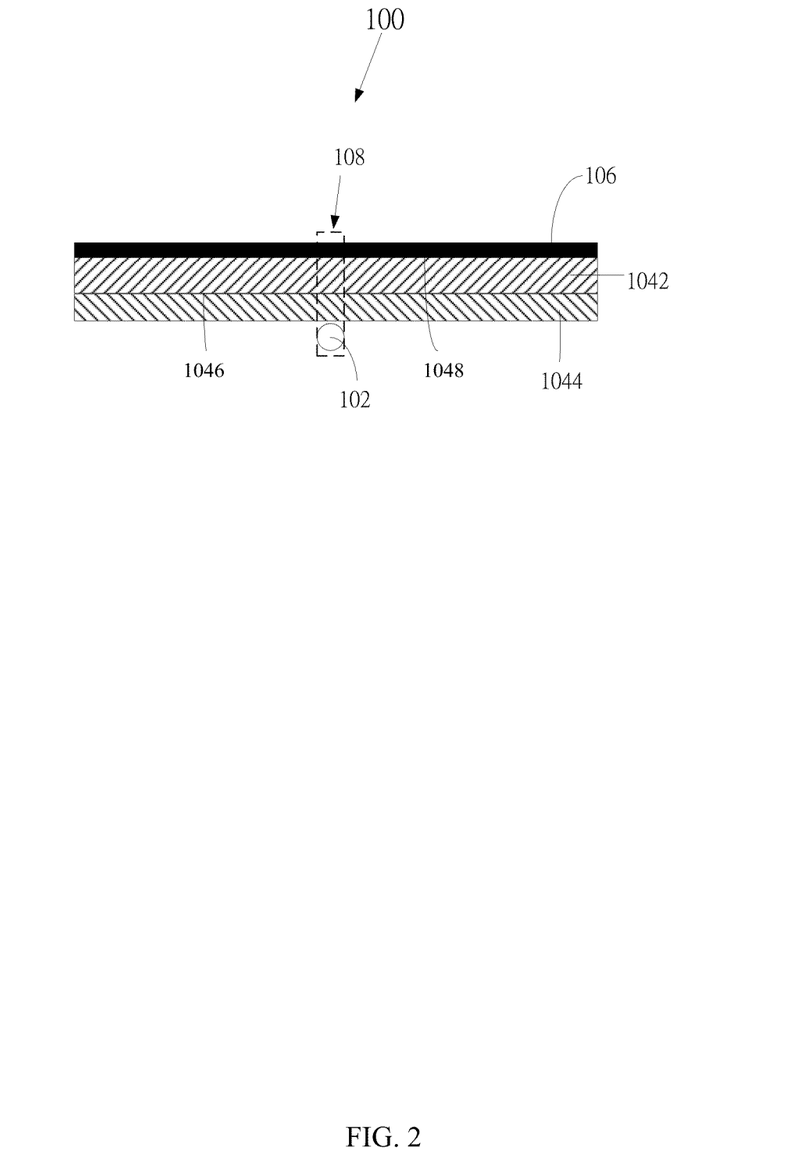
FIG. 2 is a side structural schematic view of the solar battery in FIG. 1.

Referring to FIG. 1 and FIG. 2, one embodiment is described in relation to a solar battery 100. The solar battery 100 comprises a back electrode 102, a semiconductor structure 104, and an upper electrode 106. The semiconductor structure 104 defines a first surface 1046 and a second surface 1048 opposite to the first surface 1046. The back electrode 102 is located on the first surface 1046 and is in direct contact with the first surface 1046. The upper electrode 106 is located on the second surface 1048 and is in direct contact with the second surface 1048. The semiconductor structure 104 is sandwiched between the back electrode 102 and the upper electrode 106. The back electrode 102 is a first carbon nanotube. The upper electrode 106 is a second carbon nanotube. A first extending direction of the first carbon nanotube intersects with a second extending direction of the second carbon nanotube. The semiconductor structure 104 comprises an N-type semiconductor layer 1042 and a P-type semiconductor layer 1044, and the N-type semiconductor layer 1042 and the P-type semiconductor layer 1044 are stacked with each other.

In one embodiment, only a single first carbon nanotube is located on the first surface 1046 of the semiconductor structure 104, that is, the number of the first carbon nanotube is only one. The first carbon nanotube is a metal carbon nanotube. The first carbon nanotube can be a single-walled carbon nanotube, a double-walled carbon nanotube, or a multi-walled carbon nanotube. In one embodiment, a diameter of the first carbon nanotube ranges from 0.5 nanometers to 100 nanometers. In one embodiment, the diameter of the first carbon nanotube ranges from 0.5 nanometers to 10 nanometers. In one embodiment, the first carbon nanotube is a single-walled carbon nanotube, and the diameter of the first carbon nanotube ranges from 0.5 nanometers to 2.0 nanometers. In one embodiment, the diameter of the first carbon nanotube is 1.0 nanometer.

In one embodiment, the first carbon nanotube is an inner shell carbon nanotube. The inner shell carbon nanotube refers to the innermost carbon nanotube of a double-walled carbon nanotube or a multi-walled carbon nanotube. The inner shell carbon nanotube can be pulled out from an ultra-long double-walled carbon nanotube or an ultra-long multi-walled carbon nanotube. A length of the ultra-long double-walled carbon nanotube or the ultra-long multi-walled carbon nanotube is larger than 150 micrometers. In one embodiment, the length of the ultra-long double-walled carbon nanotube or the ultra-long multi-walled carbon nanotube ranges from 150 micrometers to 300 micrometers. A method of obtaining the inner shell carbon nanotube comprises stretching two ends of the ultra-long double-walled carbon nanotube or the ultra-long multi-walled carbon nanotube, where outer walls of the ultra-long double-walled carbon nanotube or the ultra-long multi-walled carbon nanotube are sheared off in the middle part under tension, and the innermost wall of carbon nanotube remains in the middle part of the ultra-long double-walled carbon nanotube or the ultra-long multi-walled carbon nanotube, and selecting a section of the innermost wall of carbon nanotube to obtain the inner shell carbon nanotube. The inner shell carbon nanotube provides a clean surface with no impurities on a surface of the inner shell carbon nanotube, therefore, the first carbon nanotube as the back electrode 102 can be in good contact with the semiconductor structure 104. The first carbon nanotube is not limited to the inner shell carbon nanotube, the first carbon nanotube can also be other single-walled carbon nanotubes, double-walled carbon nanotubes, or multi-walled carbon nanotubes.

In one embodiment, only a single second carbon nanotube is located on the second surface 1048 of the semiconductor structure 104, that is, the number of the second carbon nanotube is only one. The second carbon nanotube is a metal carbon nanotube. The second carbon nanotube can be a single-walled carbon nanotube, a double-walled carbon nanotube, or a multi-walled carbon nanotube. In one embodiment, a diameter of the second carbon nanotube ranges from 0.5 nanometers to 100 nanometers. In one embodiment, the diameter of the second carbon nanotube ranges from 0.5 nanometers to 10 nanometers. In another embodiment, the second carbon nanotube is a single-walled carbon nanotube, and the diameter of the second carbon nanotube ranges from 0.5 nanometers to 2.0 nanometers. In one embodiment, the diameter of the second carbon nanotube is 1.0 nanometer. In one embodiment, the second carbon nanotube is the same as the first carbon nanotube, and the second carbon nanotube is an inner shell carbon nanotube. The inner shell carbon nanotube provides a clean surface with no impurities on a surface of the inner shell carbon nanotube, therefore, the second carbon nanotube as the upper electrode 106 can be in good contact with the semiconductor structure 104. The second carbon nanotube is not limited to the inner shell carbon nanotube, the second carbon nanotube can also be other single-walled carbon nanotubes, double-walled carbon nanotubes, or multi-walled carbon nanotubes.

The first extending direction of the first carbon nanotube intersecting with the second extending direction of the second carbon nanotube refers to that an angle is formed between the first extending direction and the second extending direction. The angle is larger than 0 degree and less than or equal to 90 degrees. In one embodiment, the first extending direction is perpendicular to the second extending direction, that is, the angle is 90 degrees.

The N-type semiconductor layer 1042 and the P-type semiconductor layer 1044 are stacked with each other. A p-n junction is formed by the N-type semiconductor layer 1042 and the P-type semiconductor layer 1044 in a direction perpendicular to the semiconductor structure 104. Each of the N-type semiconductor layer 1042 and the P-type semiconductor layer 1044 is a two-dimensional material. The two-dimensional material refers to a material in which electrons can perform plane movement freely only on a nanometer scale (1-100 nm) in two dimensions, such as nanofilms, superlattices, and quantum wells. The semiconductor structure 104 is a two-dimensional layered structure having a thickness of nanometer size. When the thickness of the semiconductor structure 104 is too large, such as, larger than 200 nanometers, a current modulation effect of the semiconductor structure 104 is limited. In one embodiment, the thickness of the semiconductor structure 104 ranges from 1.0 nanometer to 200 nanometers. In one embodiment, a thickness of the N-type semiconductor layer 1042 ranges from 0.5 nanometers to 100 nanometers. In one embodiment, the thickness of the N-type semiconductor layer 1042 ranges from 0.5 nanometers to 50 nanometers. In one embodiment, a thickness of the P-type semiconductor layer 1044 ranges from 0.5 nanometers to 100 nanometers. In one embodiment, the thickness of the P-type semiconductor layer 1044 ranges from 0.5 nanometers to 50 nanometers. In one embodiment, the N-type semiconductor layer 1042 is in direct contact with the upper electrode 106, and the P-type semiconductor layer 1044 is in direct contact with the back electrode 102. In some other embodiments, the N-type semiconductor layer 1042 is in direct contact with the back electrode 102, and the P-type semiconductor layer 1044 is in direct contact with the upper electrode 106.

A material of the P-type semiconductor layer 1044 and a material of the N-type semiconductor layer 1042 can be an inorganic compound semiconductor, an element semiconductor, an organic semiconductor material, or a material doped with the inorganic compound semiconductor, the element semiconductor, or the organic semiconductor material. In one embodiment, the material of the N-type semiconductor layer 1042 is molybdenum disulfide ($MoS_2$), and the thickness of the N-type semiconductor layer 1042 is 16 nanometers; and the material of the P-type semiconductor layer 1044 is tungsten diselenide ($WSe_2$), and the thickness of the P-type semiconductor layer 1042 is 14 nanometers. In another embodiment, the material of the N-type semiconductor layer 1042 is $MoS_2$, and the thickness of the N-type semiconductor layer 1042 is 7.6 nanometers; and the material of the P-type semiconductor layer 1044 is $WSe_2$, and the thickness of the P-type semiconductor layer 1044 is 76 nanometers.

Referring to FIG. 2, at an intersection of the first carbon nanotube (the back electrode 102) and the second carbon nanotube (the upper electrode 106), and in a direction perpendicular to the semiconductor structure 104, a multilayer structure 108 is formed by an overlapping region of the first carbon nanotube, the semiconductor structure 104, and the second carbon nanotube. The multilayer structure 108 defines a lateral cross section and a longitudinal section. The lateral cross section is a cross section parallel to a major surface of the semiconductor structure 104. The longitudinal section is a section perpendicular to the major surface of the semiconductor structure 104. Since a size of the first carbon nanotube and a size of the second carbon nanotube are smaller relative to the semiconductor structure 104, an area of the lateral cross section is determined by the diameter of the first carbon nanotube or the second carbon nanotube, the area of the lateral cross section of the multilayer structure 108 is also in nanometer size. An area of the longitudinal section is determined by the diameter of the first carbon nanotube, the diameter of the second carbon nanotube, and the thickness of the semiconductor structure 104. The diameter of the first carbon nanotube and the diameter of the second carbon nanotube are both in nanometers, and the thickness of the semiconductor structure 104 is also in nanometers; therefore, the area of the longitudinal section of the multilayer structure 108 is also in nanometers. The multilayer structure 108 is a nano-dimensional structure. In one embodiment, the area of the lateral cross section of the multilayer structure 108 ranges from 0.25 square nanometers to 1000 square nanometers. In one embodiment, the area of the lateral cross section of the multilayer structure 108 ranges from 1.0 square nanometer to 100 square nanometers. Therefore, a vertical point p-n junction can be formed in the overlapping region. The vertical point p-n junction is a van der Waals heterojunction.

In use of the solar battery 100, a p-n junction is formed on a contact surface between the N-type semiconductor layer 1042 and the P-type semiconductor layer 1044. The excess electrons in the N-type semiconductor layer 1042 on the contact surface tend to the P-type semiconductor layer 1044, and an internal electric field from the N-type semiconductor layer 1042 to the P-type semiconductor layer 1044 is formed. When sunlight gets through the upper electrode 106, the p-n junction generates a plurality of electron-hole pairs under the excitation of sunlight. The plurality of electron-hole pairs is separated by the internal electric field, the electrons in the N-type semiconductor layer 1042 move toward the upper electrode 106, and the holes in the P-type semiconductor layer 1044 move toward the back electrode 102. The electrons are collected by the upper electrode 106 and the holes are collected by the back electrode 102, and a current is formed. The current flows along a cross-sectional surface of the multilayer structure 108. A working part of the solar battery 100 is the multilayer structure 108. As such, a size of the solar battery 100 is larger than or equal to the multilayer structure 108. As such, the solar battery 100 is in nanoscale. The solar battery 100 has a nano-scale size and a high integrity.

Figure 3:
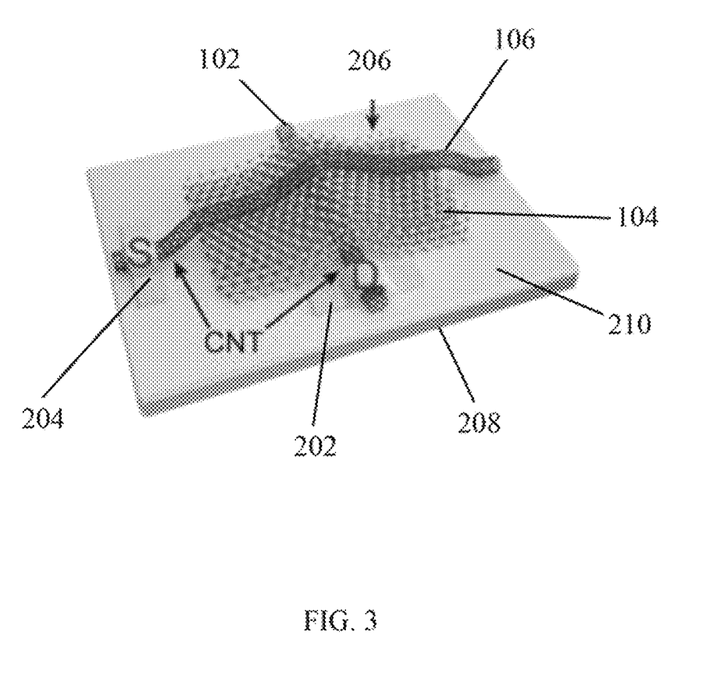
FIG. 3 is a structural schematic view of one embodiment of another solar battery.
Figure 4:
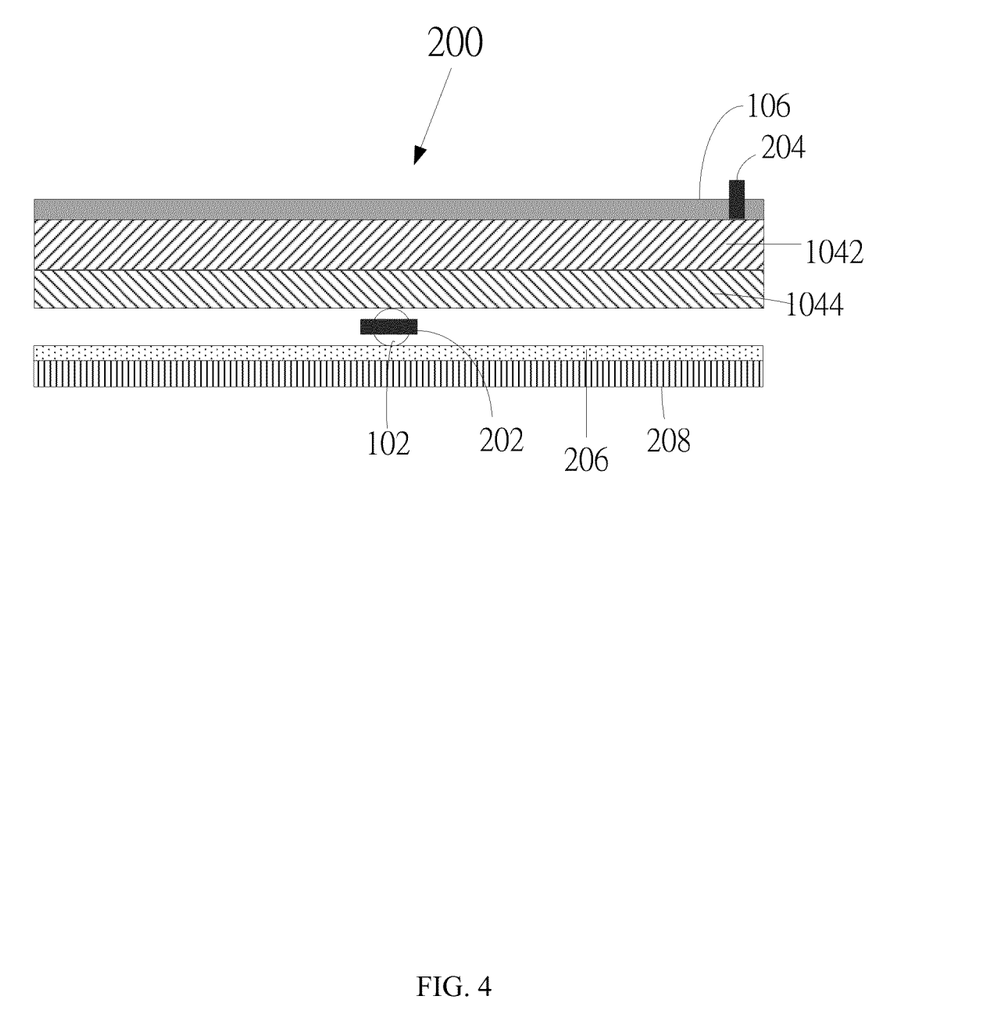
FIG. 4 is a side structural schematic view of the solar battery in FIG. 2.

Referring to FIG. 3, one embodiment is described in relation to a solar battery 200. The solar battery 200 comprises a first electrode 202, a second electrode 204, a solar battery cell 206, a grid electrode 208, and an insulating layer 210. Characteristics of the solar battery cell 206 are the same as that of the solar battery 100 discussed before. The solar battery cell 206 is insulated from the grid electrode 208 by the insulating layer 210, the first electrode 202 is electrically connected to the back electrode 102, the second electrode 204 is electrically connected to the upper electrode 106. The grid electrode 208 is insulated from the solar battery cell 206, the first electrode 202, and the second electrode 204 through the insulating layer 210.

The grid electrode 208 and the insulating layer 210 are stacked with each other. The solar battery cell 206 is located on a surface of the insulating layer 210, and the insulating layer 210 is located between the grid electrode 208 and the solar battery cell 206. The first carbon nanotube as the back electrode 102 is directly disposed on the surface of the insulating layer 210. The semiconductor structure 104 is located above the first carbon nanotube, and the first carbon nanotube is located between the semiconductor structure 104 and the insulating layer 210, and the second carbon nanotube as the upper electrode 106 is located above the semiconductor structure 104. In the present disclosure, the first carbon nanotube is located on and in direct contact with the surface of the insulating layer 210, the first carbon nanotube is close to the grid electrode 208, and the second carbon nanotube is far away from the grid electrode 208. As such, the grid electrode 208 can be used to control the solar battery cell 206, and the second carbon nanotube will not generate a shielding effect between the semiconductor structure 104 and the grid electrode 208. In one embodiment, the second carbon nanotube is located on a surface of the N-type semiconductor layer 1042, and the first carbon nanotube is located on a surface of the P-type semiconductor layer 1044; and the P-type semiconductor layer 1044 is an $MoS_2$ layer with a thickness of 16 nanometers, and the N-type semiconductor layer 1042 is a $WSe_2$ layer with a thickness of 14 nanometers.

The first electrode 202 and the second electrode 204 are made of conductive materials, such as metal, Indium Tin Oxides (ITO), Antimony Tin Oxide (ATO), conductive silver paste, carbon nanotubes, or any other suitable conductive materials. The metal can be aluminum, copper, tungsten, molybdenum, gold, titanium, palladium, or any combination of alloys. In one embodiment, the first electrode 202 and the second electrode 204 are both conductive films. A thickness of the conductive film ranges from 2 microns to 100 micrometers. In one embodiment, the first electrode 202 and the second electrode 204 are metal composite structures formed by compounding metal Au on a surface of metal Ti. A thickness of the metal Ti is about 5.0 nanometers. A thickness of the metal Au is about 60 nanometers. In one embodiment, the first electrode 202 is located at one end of the first carbon nanotube and adhered to a surface of the first carbon nanotube, where the metal Ti is disposed on the surface of the first carbon nanotube, and the metal Au is disposed on the surface of the metal Ti; and the second electrode 204 is located at one end of the second carbon nanotube and adhered to a surface of the second carbon nanotube, where the metal Ti is disposed on the surface of the second carbon nanotube, and the metal Au is disposed on the surface of the metal Ti.

A material of the insulating layer 210 is an insulating material. The material of the insulating layer 210 can be hard materials such as silicon nitride or silicon oxide. The material of the insulating layer 210 can also be flexible materials such as benzocyclobutene (BCB), polyester or acrylic resin. A thickness of the insulating layer 210 can be ranged from 2 nanometers to 100 micrometers. In one embodiment, the material of the insulating layer 210 is silicon nitride, and the thickness of the insulating layer 210 is 50 nanometers.

The grid electrode 208 is made of a conductive material. The conductive material may be selected from a group consisting of metal, ITO, ATO, conductive silver paste, conductive polymer, and conductive carbon nanotube. The metallic material may be aluminum, copper, tungsten, molybdenum, gold, titanium, palladium, or any combination of alloys. In this embodiment, the grid electrode 208 is a layered structure, the insulating layer 210 is located on a surface of the grid electrode 208. The first electrode 202, the second electrode 204, and the solar battery cell 206 are located on the insulating layer 210, and supported by the grid electrode 208 and the insulating layer 210.

In use of the solar battery 200, sunlight is radiated to the semiconductor structure 104 through the upper electrode 106. Due to the van der Waals heterostructure formed between the semiconductor structure 104, the back electrode 102 and the upper electrode 106, a photovoltaic effect can be generated, and light energy is converted into electricity energy.

The solar battery of the present disclosure has following characters. First, the solar battery is formed by two intersecting carbon nanotubes sandwiching a two-dimensional semiconductor structure, since the diameters of the two carbon nanotubes are in nanometer size, and the thickness of the two-dimensional semiconductor structure is also in nanometer size, at the intersection of the two carbon nanotubes, a nano-sized p-n junction is formed at the overlapping region of the two carbon nanotubes and the semiconductor structure. Therefore, the size of the solar battery can be reduced to a nano-size. Second, each of the two electrodes of the solar battery is a carbon nanotube. Since absorption or reflection of light by carbon nanotubes can be neglectable and carbon nanotubes have excellent light transmission, the solar battery of the present disclosure has high photoelectric conversion efficiency. Third, carbon nanotubes have excellent electrical and mechanical properties; therefore, the solar battery has high photoelectric conversion efficiency, excellent durability, and uniform resistance.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A solar battery comprising: a first electrode, a second electrode, a solar battery cell, a grid electrode, and an insulating layer, the solar battery cell insulated from the grid electrode by the insulating layer, wherein the solar battery cell is electrically connected to the first electrode and the second electrode; and the grid electrode is insulated from the solar battery cell, the first electrode, and the second electrode through the insulating layer, and the solar battery cell comprises:
   a semiconductor structure defining a first surface and a second surface opposite to the first surface, wherein the semiconductor structure consists of an N-type semiconductor layer and a P-type semiconductor layer stacked with each other;
   a back electrode located on the first surface and being in direct contact with the first surface; and
   an upper electrode located on the second surface and being in direct contact with the second surface,
   wherein the back electrode comprises a first carbon nanotube, the upper electrode comprises a second carbon nanotube, and a first extending direction of the first carbon nanotube intersects with a second extending direction of the second carbon nanotube; and a multilayer structure is formed by an overlapping region of the first carbon nanotube, the semiconductor structure and the second carbon nanotube, each of the first carbon nanotube and the second carbon nanotube is an inner shell carbon nanotube, and the inner shell carbon nanotube is an innermost wall of a double-walled carbon nanotube or a multi-walled carbon nanotube, and a surface of the inner shell carbon nanotube has no impurities.

2. The solar battery of claim 1, wherein the overlapping region comprises a vertical point p-n junction.

3. The solar battery of claim 2, wherein the vertical point p-n junction is a van der Waals heterojunction.

4. The solar battery of claim 1, wherein only a single first carbon nanotube is located on the first surface of the semiconductor structure, and only a single second carbon nanotube is located on the second surface of the semiconductor structure.

5. The solar battery of claim 1, wherein the inner shell carbon nanotube is an innermost wall of an ultra-long double-walled carbon nanotube or an ultra-long multi-walled carbon nanotube, and a length of the ultra-long double-walled carbon nanotube or the ultra-long multi-walled carbon nanotube is larger than 150 micrometers.

6. The solar battery of claim 5, wherein the length of the ultra-long double-walled carbon nanotube or the ultra-long multi-walled carbon nanotube ranges from 150 micrometers to 300 micrometers.

7. The solar battery of claim 1, wherein a diameter of the first carbon nanotube ranges from 0.5 nanometers to 10 nanometers.

8. The solar battery of claim 1, wherein a diameter of the second carbon nanotube ranges from 0.5 nanometers to 10 nanometers.

9. The solar battery of claim 1, wherein a thickness of the semiconductor structure ranges from 1.0 nanometer to 200 nanometers.

10. The solar battery of claim 1, wherein a thickness of the N-type semiconductor layer ranges from 0.5 nanometers to 50 nanometers, and a thickness of the P-type semiconductor layer ranges from 0.5 nanometers to 50 nanometers.

11. The solar battery of claim 1, wherein a material of the N-type semiconductor layer is molybdenum disulfide, and a material of the P-type semiconductor layer is tungsten diselenide.

12. The solar battery of claim 1, wherein the first extending direction is perpendicular to the second extending direction.

13. The solar battery of claim 1, wherein each of the first carbon nanotube and the second carbon nanotube is a metal carbon nanotube.

14. The solar battery of claim 1, wherein the multilayer structure defines a lateral cross section, and the lateral cross section is a cross section parallel to a major surface of the semiconductor structure; and an area of the lateral cross section ranges from 1.0 square nanometer to 100 square nanometers.

15. The solar battery of claim 1, wherein each of the first electrode and the second electrode is a metal composite structure formed by compounding metal Au on a surface of metal Ti.

16. The solar battery of claim 15, wherein the first electrode is located at one end of the first carbon nanotube and adhered to a surface of the first carbon nanotube; and the metal Ti is disposed on the surface of the first carbon nanotube, and the metal Au is disposed on the surface of the metal Ti.

17. The solar battery of claim 15, wherein the second electrode is located at one end of the second carbon nanotube and adhered to a surface of the second carbon nanotube; and the metal Ti is disposed on the surface of the second carbon nanotube, and the metal Au is disposed on the surface of the metal Ti.

18. A solar battery comprising:
   a semiconductor structure defining a first surface and a second surface opposite to the first surface, wherein the semiconductor structure comprises an N-type semiconductor layer and a P-type semiconductor layer stacked with each other;
   a back electrode located on the first surface and being in direct contact with the first surface; and
   an upper electrode located on the second surface and being in direct contact with the second surface,
   wherein the back electrode comprises a first carbon nanotube, the upper electrode comprises a second carbon nanotube, and a first extending direction of the first carbon nanotube intersects with a second extending direction of the second carbon nanotube; and a multi-layer structure is formed by an overlapping region of the first carbon nanotube, the semiconductor structure and the second carbon nanotube, each of the first carbon nanotube and the second carbon nanotube is an inner shell carbon nanotube, and the inner shell carbon nanotube is an innermost wall of a double-walled carbon nanotube or a multi-walled carbon nanotube, and a surface of the inner shell carbon nanotube has no impurities.

19. A solar battery of claim 18, wherein only a single first carbon nanotube is located on the first surface of the semiconductor structure, and only a single second carbon nanotube is located on the second surface of the semiconductor structure.

\* \* \* \* \*